(12) United States Patent
Toffolon et al.

(10) Patent No.: US 7,616,074 B2
(45) Date of Patent: Nov. 10, 2009

(54) LOW-POWER FAST-STARTUP OSCILLATOR WITH DIGITAL FEEDBACK CONTROL

(75) Inventors: Dino Anthony Toffolon, Stoney Creek (CA); Jasjeet Singh, Brampton (CA); Nacer Eddine Belabbes, Brampton (CA)

(73) Assignee: Synopsys, Inc.

( * ) Notice: Subject to any disclaimer, the term of this patent is extended or adjusted under 35 U.S.C. 154(b) by 36 days.

(21) Appl. No.: 11/770,170

(22) Filed: Jun. 28, 2007

(65) Prior Publication Data

US 2009/0002087 A1 Jan. 1, 2009

(51) Int. Cl.
*H03L 7/099* (2006.01)
(52) U.S. Cl. .................. 331/185; 331/183; 331/158
(58) Field of Classification Search ............. 331/74–77, 331/106, 109, 154, 158, 160, 175, 176, 182, 331/183, 185, 186
See application file for complete search history.

(56) References Cited

U.S. PATENT DOCUMENTS 4,956,618 A * 9/1990 Ulmer ................. 331/116 FE
2004/0212444 A1 * 10/2004 Peng ........................ 331/175
2007/0024385 A1 * 2/2007 Greenberg ................. 331/158

* cited by examiner

*Primary Examiner*—James H. Cho
*Assistant Examiner*—Jany Tran
(74) *Attorney, Agent, or Firm*—Park, Vaughan & Fleming LLP; Anthony P. Jones

(57) ABSTRACT

Embodiments of the present invention provide a system for controlling a startup time of an oscillator circuit. The system includes a variable current source coupled to the oscillator circuit, wherein a startup time of the oscillator circuit is proportional to a bias current input into the oscillator circuit from the variable current source. The system also includes a control mechanism coupled to the variable current source and to the output of the oscillator circuit. Upon startup, the control mechanism is configured to adjust the variable current source to input a large startup bias current into the oscillator circuit. After the oscillator circuit outputs a predetermined number of oscillations during startup, the control mechanism is configured to adjust the variable current source to decrease its current to a smaller steady-state bias current into the oscillator circuit.

18 Claims, 7 Drawing Sheets

LOW-POWER FAST-STARTUP OSCILLATOR WITH DIGITAL FEEDBACK CONTROL

BACKGROUND

1. Field of the Invention

Embodiments of the present invention relate to circuits. More specifically, embodiments of the present invention relate to a low-power, fast-startup oscillator with digital feedback control.

2. Related Art

Circuit designers have struggled to design a simple and efficient low-power crystal oscillator that can provide a startup time of less than 1 ms as is required in certain electronic devices (e.g., universal serial bus (USB) devices). Such an oscillator is difficult to design because the conditions for sustaining oscillations are very different from the conditions required to initiate oscillations within the required startup time.

Figure 1A:
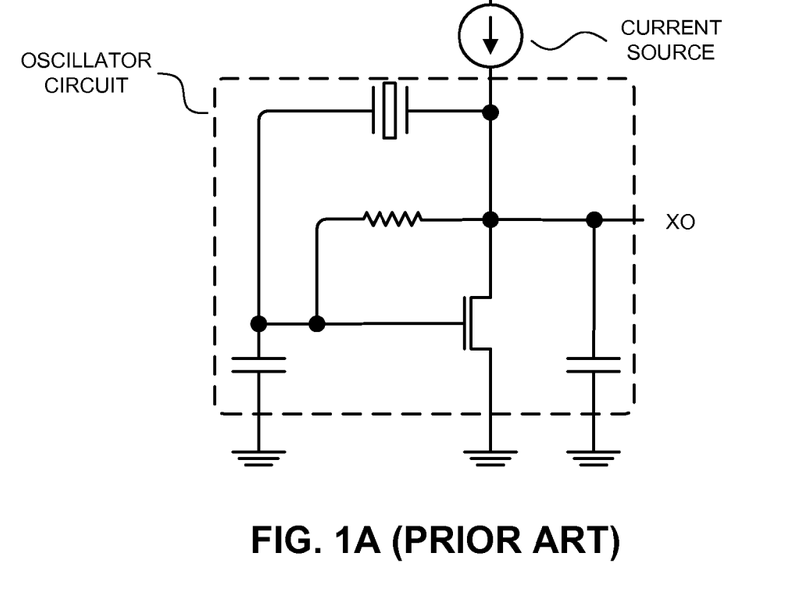
FIG. 1A presents a circuit diagram illustrating an oscillator circuit.

FIG. 1A presents a circuit diagram illustrating an oscillator circuit. Such oscillator circuits may only need 100 µA of bias current to sustain oscillations (where the oscillator loop gain>1), but may need in excess of 10 mA of bias current in order to commence oscillation in less than 1 ms. (Note that with the bias current of 10 mA, the magnitude of the oscillations produced by the oscillator circuit eventually becomes very large, so the 10 mA bias current cannot be sustained in most oscillator circuits.)

In order to avoid the need to design oscillator circuits that meet specific startup timing requirements, some circuit designers have proposed leaving the oscillator circuit always "on," even when the oscillator circuit is not required to be on (e.g., during the "suspend" state for a USB device). Although simple, this type of design consumes an excessive amount of power.

Figure 1B:
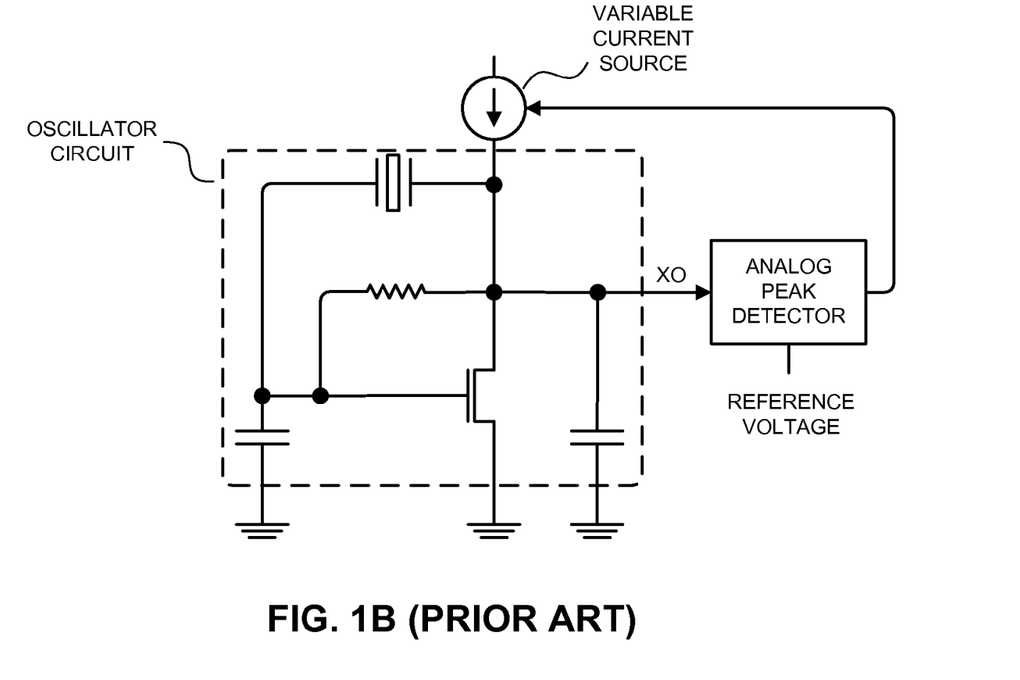
FIG. 1B presents a circuit diagram illustrating an oscillator circuit with an automatic gain control (AGC) loop.

Some circuit designers have suggested using an automatic gain control (AGC) loop to control the magnitude of the oscillations in the oscillator circuit in order to meet the 1 ms startup timing requirement. For example, FIG. 1B presents a circuit diagram illustrating an oscillator circuit with such an AGC loop. The AGC loop includes an analog peak detector and a low-bandwidth operational amplifier (op-amp) that controls a variable current source. When the oscillator is powered on, the analog peak detector increases the current provided by the variable current source until the magnitude of the oscillations output by the oscillator increases beyond a predefined limit (i.e., the reference voltage). When the oscillation amplitudes surpasses the predefined limit, the analog peak detector reduces the current provided by the variable current source such that the oscillation amplitude matches that of the reference voltage. This technique adjusts the startup time by monitoring the gain of the amplifier and adjusting the bias current accordingly.

Unfortunately, in the oscillator circuit with the AGC loop, the speed of the ramping of the current must be limited or else the AGC loop itself can oscillate. If the current cannot be ramped quickly, the oscillator circuit may not be able to meet the required startup time without using very large amplifying devices. Moreover, the AGC loop is an analog loop and hence is sensitive to noise coupling which can cause increased jitter. Furthermore, the time-constants of the loop are affected by process, voltage, and temperature, which can cause the startup time to vary.

Hence, what is needed is an oscillator circuit without the above-described problems.

SUMMARY

Embodiments of the present invention provide a system for controlling a startup time of an oscillator circuit. The system includes a variable current source coupled to the oscillator circuit, wherein a startup time of the oscillator circuit is proportional to a bias current input into the oscillator circuit from the variable current source. The system also includes a control mechanism coupled to the variable current source and to the output of the oscillator circuit. Upon startup, the control mechanism is configured to adjust the variable current source to input a large startup bias current into the oscillator circuit. After the oscillator circuit outputs a predetermined number of oscillations during startup, the control mechanism is configured to adjust the variable current source to decrease its current to a smaller steady-state bias current into the oscillator circuit.

In some embodiments, the system includes an oscillation-detection mechanism in the control mechanism. The oscillation-detection mechanism detects transitions in the output signal produced by the oscillator circuit and adjusts the variable current source after the oscillator circuit outputs a predetermined number of transitions during startup.

In some embodiments, the oscillation-detection mechanism includes: (1) a comparison mechanism configured to detect transitions in the output signal of the oscillator; (2) a counter mechanism that counts the transitions in the output signal of the oscillator; and (3) an adjustment mechanism that adjusts the variable current source when the count exceeds a predetermined number.

In some embodiments, the variable current source is configured to output a bias current proportional to a value of a control signal, wherein the adjustment mechanism is configured to change the value of the control signal when adjusting the variable current source.

In some embodiments, the system includes a mapping mechanism configured to convert an adjustment from the adjustment mechanism into a value for the control signal which is used to adjust the variable current source. In some embodiments, the mapping mechanism is configured to use the count to determine the value for the control signal.

In some embodiments, the variable current source is configured to be controlled digitally, wherein the control signal includes one or more bits arranged in a control word.

In some embodiments, when detecting transitions in the output signal of the oscillator, the comparison mechanism is configured to detect if the output signal of the oscillator has transitioned through a reference value, wherein the reference value is: a predetermined value; a voltage on a node within the oscillator circuit; or an external voltage value.

In some embodiments, the control mechanism is configured to adjust the variable current source to one or more bias currents between the large startup bias current and the steady-state bias current when a corresponding predetermined number of oscillations have occurred during startup.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Oscillator Circuit with Feedback Loop

Figure 2A:
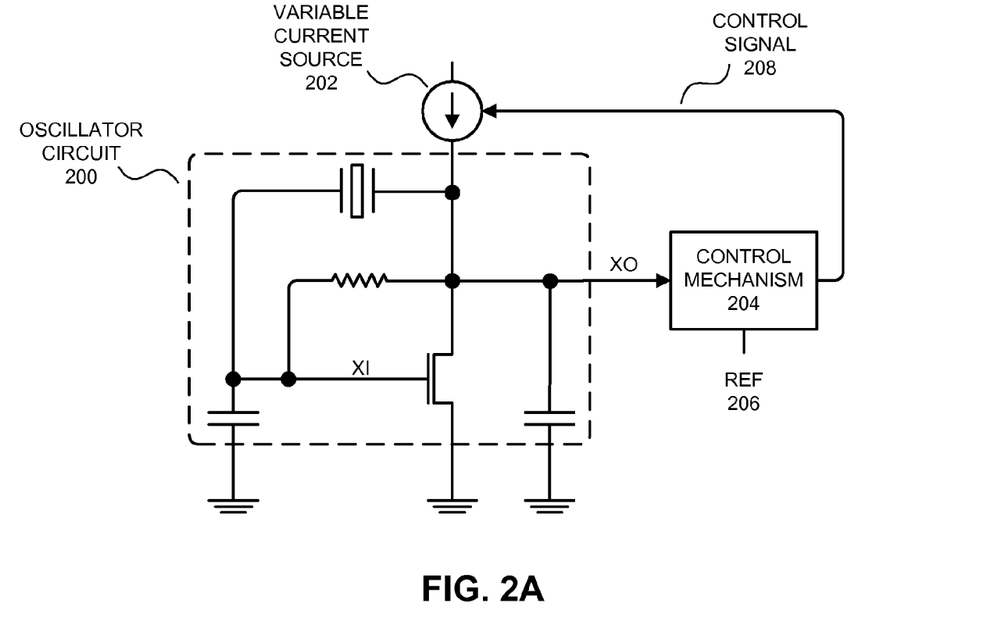
FIG. 2A presents an oscillator circuit with a variable current source and a feedback loop in accordance with embodiments of the present invention.

FIG. 2A presents an oscillator circuit 200 with a variable current source 202 and a feedback loop in accordance with embodiments of the present invention. The feedback loop includes control mechanism 204, which controls a bias current output by variable current source 202 using control signal 208.

Oscillator circuit 200 can be a crystal oscillator circuit that produces an oscillating output signal (on node XO) for which the amplitude increases with increases in a bias current provided by variable current source 202. Oscillator circuits are known in the art and are therefore not described in more detail.

Although oscillator circuit 200 is presented for the purposes of illustration, some embodiments of the present invention use other types of oscillator circuits. Generally, embodiments of the present invention apply to oscillator circuits for which the magnitude of the output oscillations can be controlled using either analog or digital signals (e.g., a voltage-controlled oscillator or a digitally-controlled oscillator).

Oscillator circuit 200 has a "startup time," which is the time required for oscillator circuit 200 to progress from an initial state (with a non-oscillating output signal) to an active state (with an output signal oscillating stably at a predetermined voltage). The startup time for oscillator circuit 200 varies according to the bias current provided by variable current source 202. For example, a larger bias current can cause oscillator circuit 200 to progress from the initial state to the active state more quickly than a smaller bias current.

Figure 3:
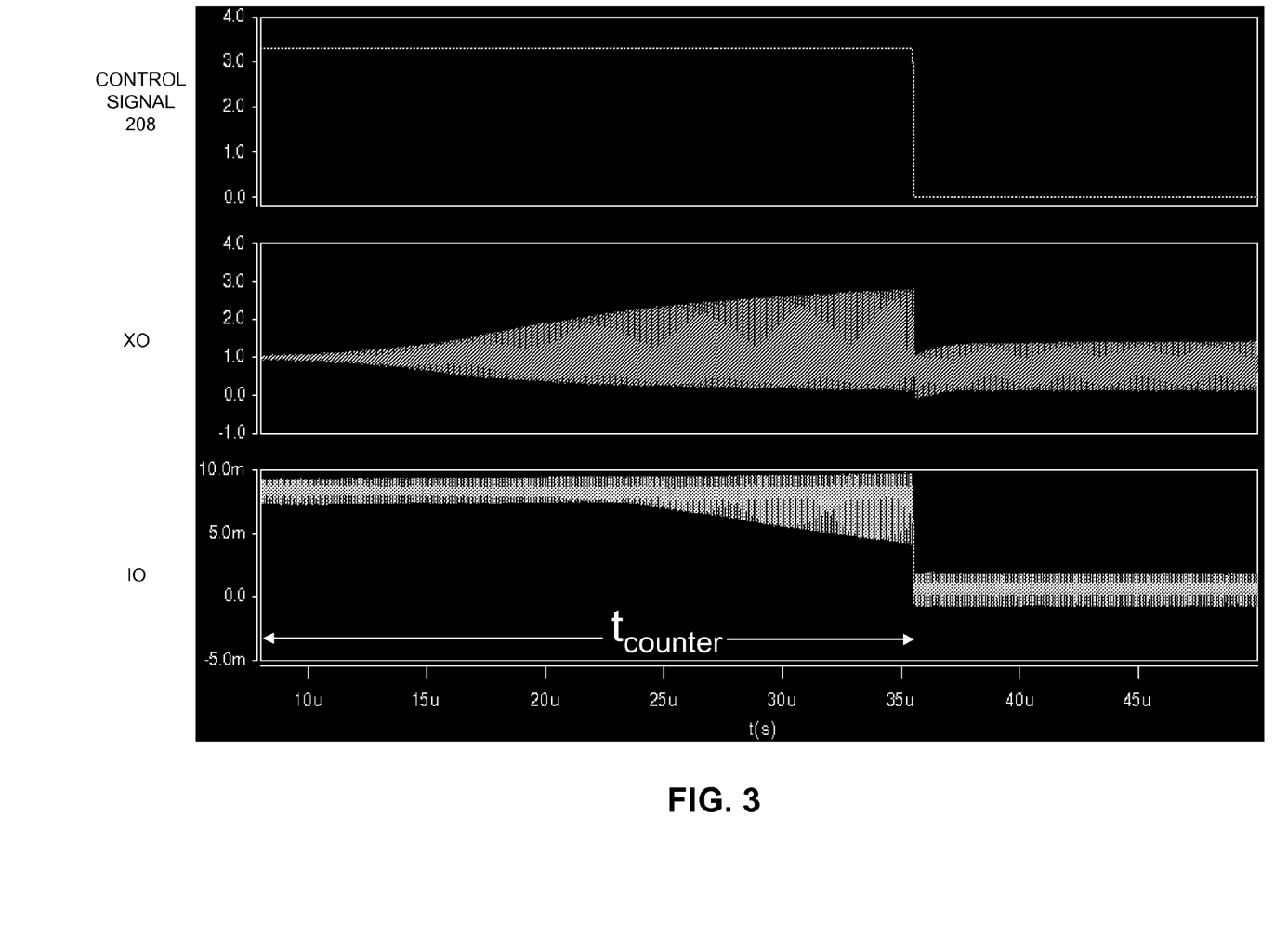
FIG. 3 presents a graph illustrating the response of an oscillator circuit to a control signal in accordance with embodiments of the present invention.

In some embodiments of the present invention, the feedback loop controls the startup time for oscillator circuit 200. In order to control the startup time, the feedback loop initially adjusts variable current source 202 to input a large bias current into oscillator circuit 200. The large bias current causes the output signal of oscillator circuit 200 to progress quickly from the initial state to an intermediate state where the output oscillations are of sufficiently large magnitude to ensure that the active state has been reached. Then, when a predetermined number of oscillations have occurred after the initial startup, the feedback loop adjusts variable current source 202 to input a reduced "steady-state" bias current into oscillator circuit 200. The steady-state bias current causes the oscillator circuit to settle into a steady-state, where the output oscillations are of a predetermined magnitude. For example, referring to FIG. 3, given an initial bias current of approximately 8 mA, the oscillations output from oscillator circuit 200 progress from 0V to approximately 3 V in 35 µS. Then, given a bias current of approximately 100 µA, the oscillations settle into a steady-state oscillation of approximately 1 V.

Note that in FIG. 2A, the amplification device (with node XI as the device's gate input) is shown as an NMOS transistor. However, in alternative embodiments, the amplification device is a PMOS transistor or another type of amplification device.

In some embodiments of the present invention, the predetermined number of oscillations is sufficient to ensure that the active state has been reached, while preventing the oscillations from becoming too large in magnitude and potentially disrupting the operation of oscillator circuit 200. Note that the active state has been reached when the feedback loop can reduce the bias current and oscillator circuit 200 will maintain output oscillations of a predetermined magnitude.

In some embodiments of the present invention, when determining when a predetermined number of oscillations have occurred before reducing the bias current, control mechanism 204 counts transitions on the output signal (XO) of oscillator circuit 200. In some embodiments, when making this determination, control mechanism 204 keeps track of the number of times that the output of oscillator circuit 200 makes a predetermined transition (e.g., negatively-sloped) through a predetermined voltage level. In alternative embodiments, control mechanism 204 detects: peaks or valleys, relative magnitude, zero-crossings, or another aspect of the output signal of oscillator circuit 200 that indicates when oscillations have occurred.

In some embodiments, variable current source 202 is replaced by at least two separate current sources. One current source (the "steady-state current source") outputs the steady-state bias current (e.g., 100 µA), while the other current source(s) output the large startup bias current (e.g., 10 mA). In these embodiments, the other current source(s) can be enabled during startup in order to cause oscillator circuit 200 to progress from the initial state to the active state more quickly, but can be disabled in the steady-state while the steady-state current source provides the steady-state bias current. In the case where there are two or more other current sources, the other current sources each provide a portion of the large startup bias current and can be selectively disabled to provide bias currents of predetermined values between the large startup bias current and the steady-state bias current.

Figure 2B:
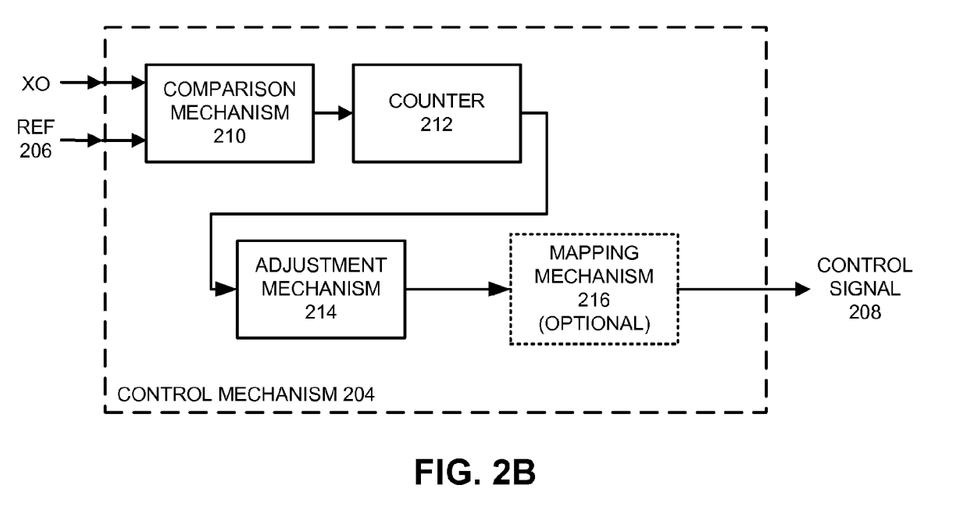
FIG. 2B presents a block diagram that illustrates an exemplary control mechanism in accordance with embodiments of the present invention.

FIG. 2B presents a block diagram that illustrates an exemplary control mechanism 204 in accordance with embodiments of the present invention. During operation, control mechanism 204 controls the bias current input into oscillator circuit 200. At startup, control mechanism 204 adjusts variable current source 202 to input a large startup bias current into oscillator circuit 200. Control mechanism 204 then resolves when a predetermined number of oscillations have occurred and reduces the bias current to the steady-state current (as described above).

In some embodiments of the present invention, control mechanism 204 includes comparison mechanism 210, counter 212, and adjustment mechanism 214. Control mechanism 204 can optionally include mapping mechanism 216. Although we describe embodiments where control mechanism 204 includes these elements, in alternative embodiments, control mechanism 204 can include more or fewer elements that are used to keep track of the number of oscillations on the output of oscillator circuit 200 (and to control the bias current input to oscillator circuit 200).

In some embodiments of the present invention, comparison mechanism 210 takes signal XO as an input and compares XO to the reference value REF 206. In some embodiments of the present invention, REF 206 is a predetermined value. In other embodiments, REF 206 is an analog voltage (such as a voltage internal to the circuit or a voltage external to the circuit). For example, if XO is larger than REF 206, comparison mechanism 210 can output a logical 1, but if XO is smaller then REF 206, comparison mechanism 210 can output a logical 0.

In alternative embodiments, comparison mechanism 210 compares two or more values of XO to one another to determine when a transition occurs. For example, comparison mechanism 210 may compare two or more sequential values of XO to determine when a peak has occurred. On the other hand, comparison mechanism 210 may compare two sequential values of XO to determine when a negatively-sloped zero-crossing has occurred. (Note that in these embodiments, comparison mechanism 210 may not compare XO to REF 206.) In these embodiments, comparison mechanism 210 can toggle the logical state of the output when a transition has occurred.

The output of comparison mechanism 210 is forwarded to counter 212, which counts the transitions in the output of comparison mechanism 210. For example, counter 212 can count rising transitions, such as transitions from logical 0 to logical 1 in the output signal of comparison mechanism 210. Alternatively, counter 212 can count falling transitions or all transitions.

Counter 212 outputs a digital word that contains the number of counted transitions to adjustment mechanism 214. Adjustment mechanism 214 then compares the received transition-count word to a reference digital word. If the transition-count word is larger than the reference word (i.e., of the count has exceeded a predetermined amount), adjustment mechanism 214 adjusts the value of control signal 208 to reduce the bias current input into oscillator circuit 200.

In some embodiments, adjustment mechanism 214 selectively converts the digital count value into an analog signal used to control variable current source 202 (i.e., adjust the bias current). In other embodiments, adjustment mechanism 214 uses the value of the count when determining the adjustment for the bias current. For example, adjustment mechanism 214 can use the count value to look up an analog control signal value in a lookup table. Alternatively, the range of possible count values can be segmented, with each segment corresponding to a particular value of analog control signal 208.

Alternative embodiments use "digitally-controlled" variable current sources 202. For example, the digitally-controlled variable current source 202 can include circuitry for controlling the output current using a number of control bits (for ease of description we refer to these control bits as a control "word," although the number of bits is not limited to a particular size). In these embodiments, control mechanism 204 sends a control word to variable current source 202. Variable current source 202 then adjusts the bias current according to the status of the bits in the control word. In these embodiments, (1) the count itself can be used as the control word; (2) the count can be used to perform a lookup in a table for a control word; or (3) the count can be used to compute the control word.

Figure 4:
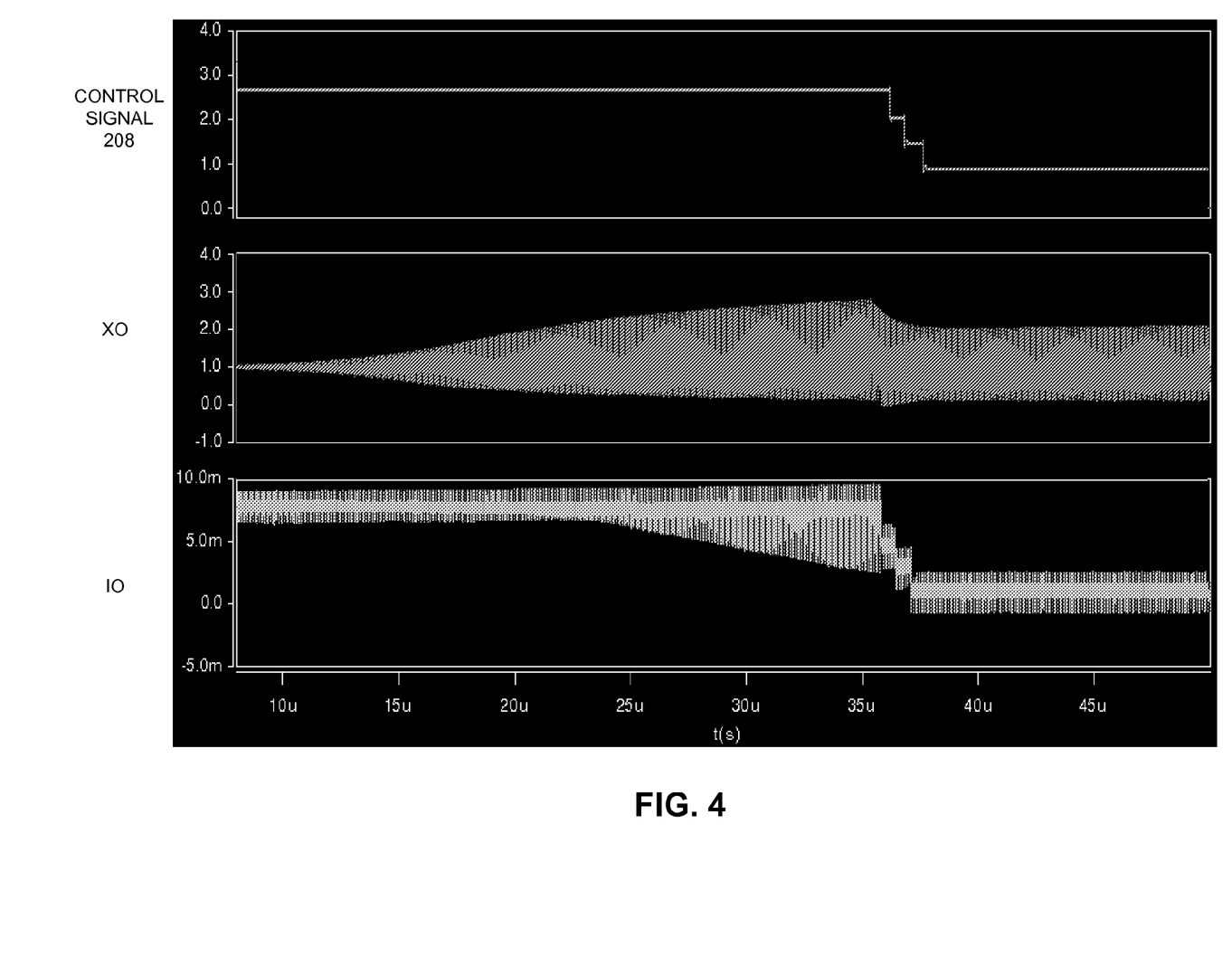
FIG. 4 presents a graph illustrating the response of an oscillator circuit to a control signal in accordance with embodiments of the present invention.

In some embodiments, control mechanism 204 makes more than one bias current adjustment between the startup bias current and the steady-state current based on the occurrence of predetermined numbers of transitions (see FIG. 4). For example, control mechanism 204 may make a first reduction to the bias current after 100 transitions have occurred and a final reduction to the bias current after 200 transitions have occurred. Alternatively, control mechanism 204 may make incremental increases in the startup bias current until a given count has been reached.

In some embodiments of the present invention, the feedback loop includes a mechanism for programming the startup time by adjusting: (1) the number of transitions before the bias current is reduced, or (2) the amount of each reduction in the bias current. For example, in some embodiments, several registers are provided that facilitate adjusting the number of transitions before each reduction in bias current and the size of the reduction in bias current.

In some embodiments of the present invention, control mechanism 204 includes mapping mechanism 216. Mapping mechanism 216 is configured to convert an adjustment from mechanism 214 into a value for control signal 208 which is used to adjust variable current source 202. In some embodiments of the present invention, mapping mechanism 216 is configured to use count from counter 212 to determine the value for control signal 208.

Embodiments of the present invention guarantee startup time without the use of complex analog feedback loops (i.e., the feedback loops used in current analog gain control (AGC) circuits). Because the circuit uses an edge count, the startup time is less sensitive to process, voltage, and temperature variations. In addition, embodiments of the present invention consume less power and area than AGC designs. Furthermore, embodiments of the present invention provide a power savings over circuits with other designs.

Figure 2C:
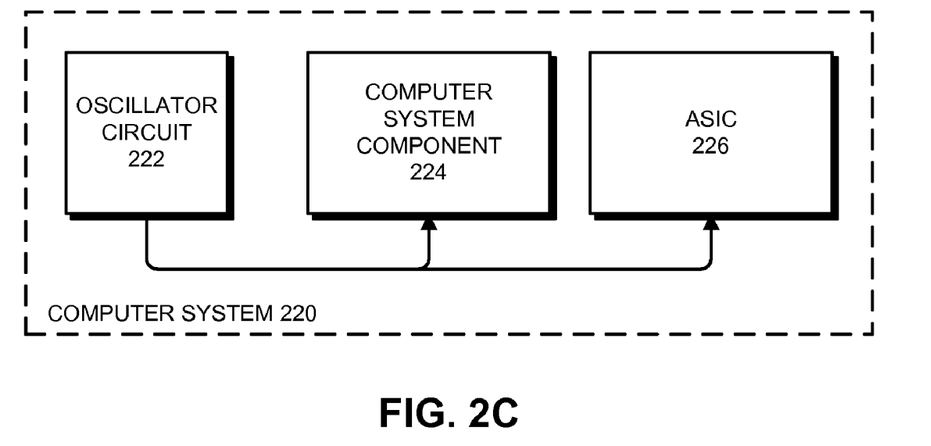
FIG. 2C presents a block diagram of a computer system in accordance with embodiments of the present invention.

FIG. 2C presents a block diagram of a computer system 220 in accordance with embodiments of the present invention. Computer system 220 includes oscillator circuit 222, computer system component 224, and application-specific integrated circuit (ASIC) 226. Oscillator circuit 222 provides a stable oscillating signal that can be used by computer system component 224 and ASIC 226. For example, the oscillating signal can be used as a clock signal or as another type of reference signal by computer system component 224 and ASIC 226. Oscillator circuit 222 includes control mechanism 204 and variable current source 202 (not shown), which facilitate starting oscillator circuit 222 more quickly.

Computer system 220 can be any type of computer system which uses an oscillating signal, including a desktop computer, a portable computing device, a USB device, a personal digital assistant, a server, a network element, a printer, an embedded computer system, a cellular phone, a media player, or another computing device. Although oscillator circuit 222 is illustrated in computer system 220, in alternative embodiments, oscillator circuit 222 is used in other types of electronic devices which use an oscillating signal, such as a memory, a controller, an ASIC, an analog circuit, or other forms of electronic device.

Waveform Graphs

FIG. 3 presents a graph illustrating the response of oscillator circuit 200 to control signal 208 in accordance with embodiments of the present invention. In FIG. 3 (as well as in FIG. 4), XO represents the voltage on the output node of the oscillator circuit 200, while IO represents the current passing through the XO node.

(Note that although we use specific numeric values for the voltages and currents in the examples in the following section, these values are approximations of the values shown in the graphs of FIG. 3 and FIG. 4.)

In embodiments of the present invention, the operation of the oscillator circuit can be divided into phases. For example, in FIG. 3, the operation of the oscillator circuit can be divided into two phases. The first phase is the startup phase, during which oscillator circuit 200 quickly reaches an intermediate state where steady-state oscillation can be ensured. The second phase is the steady-state phase, during which oscillator circuit 200 provides steady oscillations (which can then be used as timing signals for other circuits, etc.).

During the startup phase, control signal 208 is set to 3.2 V, causing variable current source 202 to input a bias current of 8 mA into oscillator circuit 200. In response, from time t=0 μS to t=35 μS, oscillator circuit 200 oscillates with rapidly increasing magnitude. As can be seen in FIG. 3, the oscillations in the first phase eventually reach a magnitude significantly larger than the magnitude of the steady-state oscillations in the second phase. (Note that if the bias current remains at 8 mA, the oscillations can grow large enough to disrupt the normal operation of oscillator circuit 200.)

In the steady-state phase, control signal 208 is reduced to 200 mV, which causes variable current source 202 to input a bias current of 100 μA into oscillator circuit 200. In response, oscillator circuit 200 settles into steady-state oscillations.

FIG. 4 presents a graph illustrating the response of oscillator circuit 200 to control signal 208 in accordance with embodiments of the present invention. In FIG. 4, the operation of the oscillator circuit can be divided into three phases. The first phase is the startup phase, during which oscillator circuit 200 quickly reaches an intermediate state where steady-state oscillation can be ensured. The second phase is a transition phase, where the control signal to the oscillator circuit is stepped down. The third phase is the steady-state phase, during which the oscillator provides steady oscillations (which can then be used as timing signals for other circuits, etc.).

During the startup phase, control signal 208 is set to 2.8 V, causing variable current source 202 to input a bias current of 7.5 mA into oscillator circuit 200. In response, from time t=0 μS to t=35 μS, oscillator circuit 200 oscillates with rapidly increasing magnitude.

In the transition phase, control signal 208 is reduced twice, from the initial 2.8 V to an intermediate voltage of 2.2 V, then to a second intermediate voltage of 1.6 V. Each reduction causes variable current source 202 to input a reduced bias current into oscillator circuit 200. In response, oscillator circuit 200 outputs successively lower-magnitude oscillations.

In the steady-state phase, control signal 208 is reduced to 1 V, which causes variable current source 202 to input a bias current of 400 μA into oscillator circuit 200. In response, oscillator circuit 200 settles into steady-state oscillations.

Bias Current Adjustment Process

Figure 5A:
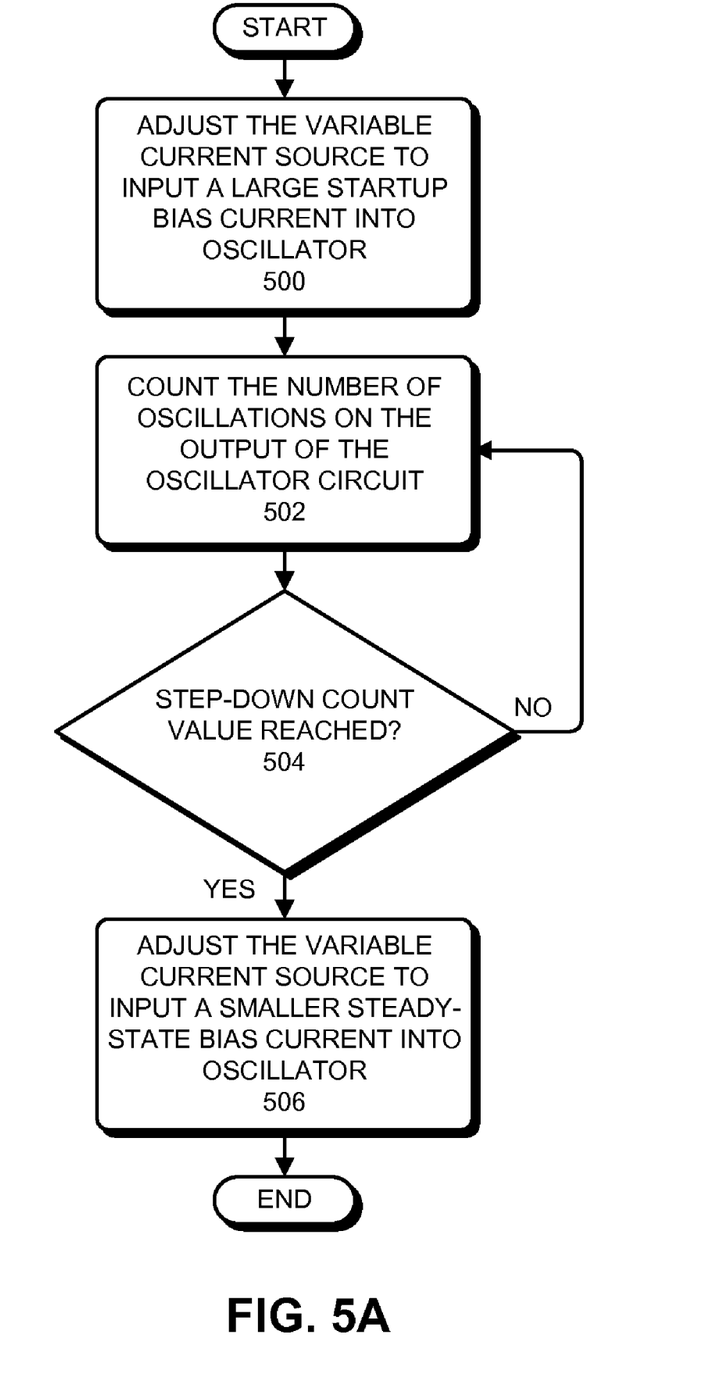
FIG. 5A presents a flowchart illustrating the process of adjusting a bias current for an oscillator circuit in accordance with embodiments of the present invention.

FIG. 5A presents a flowchart illustrating the process of adjusting a bias current for an oscillator circuit in accordance with embodiments of the present invention. The process starts when the oscillator circuit begins oscillating. For example, the oscillator may be providing a timing signal for a device that is coming out of a sleep state. The system first adjusts a variable current source to input a large startup bias current into the oscillator circuit (step 500).

The system then counts the number of oscillations on the output of the oscillator circuit (step 502). In some embodiments, the system monitors transitions of the output of the oscillator circuit. In alternative embodiments, the system monitors other signal properties, such as zero-crossings.

With each oscillation, the system determines if a step-down count value has been reached (step 504). In other words, the system determines if a predetermined number of transitions have occurred (e.g., 1000 transitions) after startup. If not, the system returns to step 502 to count the number of oscillations on the output of the oscillator circuit.

Otherwise, the system adjusts the variable current source to input a smaller steady-state bias current into the oscillator (step 506). By adjusting the bias current in this way, the system facilitates starting the oscillating output of the oscillator circuit quickly, while preventing the large startup bias current from negatively affecting the operation of the oscillator circuit.

In the embodiment described in FIG. 5A, the system first adjusts the variable current source to input a large startup bias current into the oscillator. Then, after a certain number of transitions have occurred in the output signal for the oscillator, the system adjusts the variable current source to input a smaller steady-state bias current into the oscillator. However, in alternative embodiments of the present invention, the system adjusts the variable current source more than twice during the startup sequence for the oscillator circuit. For example, FIG. 5B presents a flowchart illustrating a process for adjusting a startup bias current of an oscillator circuit more than once in accordance with embodiments of the present invention.

Figure 5B:
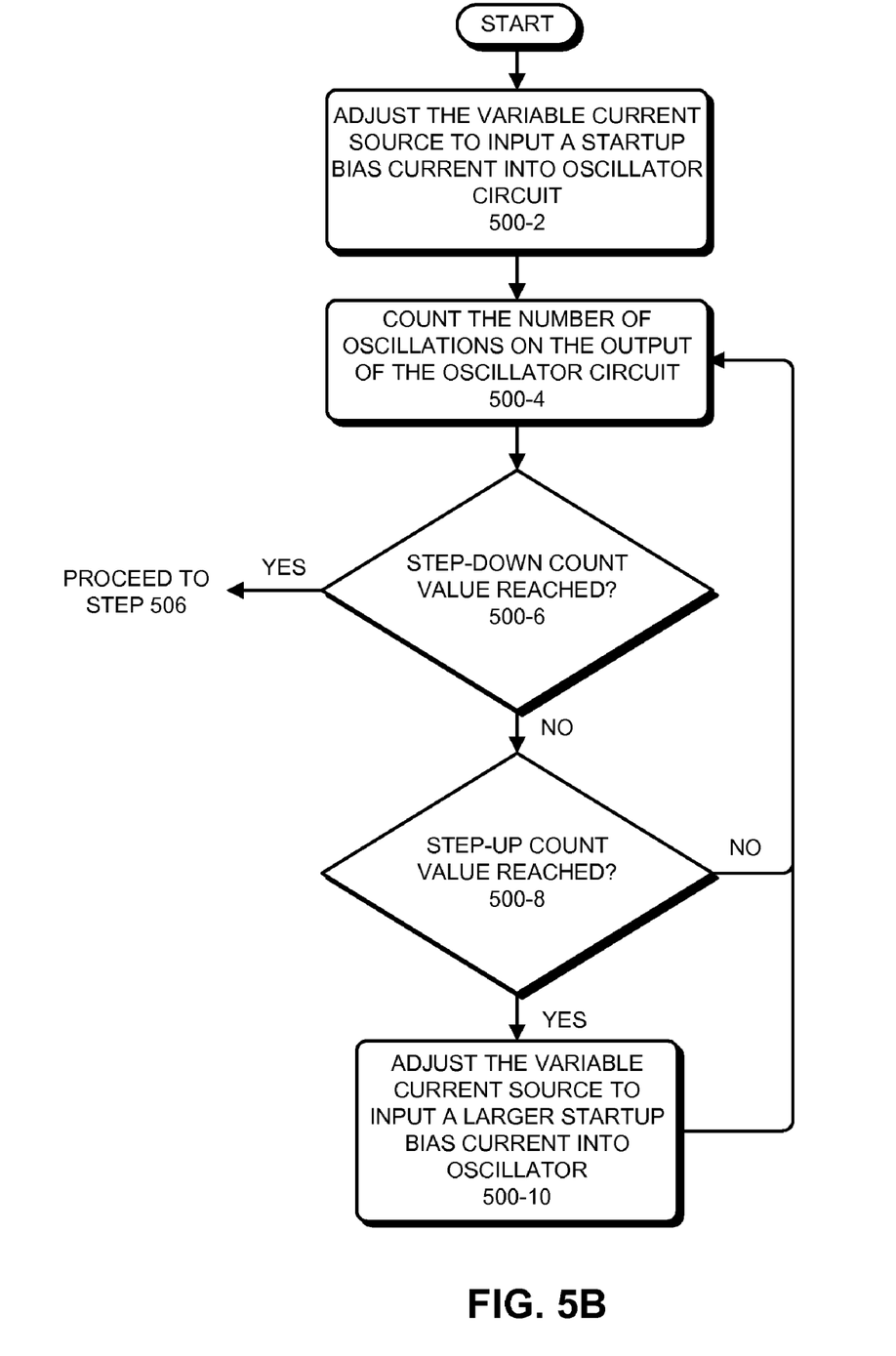
FIG. 5B presents a flowchart illustrating a process for adjusting a startup bias current of an oscillator circuit more than once in accordance with embodiments of the present invention

In some embodiments of the present invention, the process in FIG. 5B replaces step 500 in FIG. 5A. Note that a similar process could be used for adjusting the bias current from a large startup bias current to the steady state value (i.e., replacing step 506).

The process starts when the oscillator circuit begins oscillating. The system first adjusts the variable current source to input a startup bias current into oscillator circuit (step 500-2). Unlike in FIG. 5A, the system does not initially adjust the bias current to the maximum bias current value (e.g., 8 mA). Instead, the system adjusts the bias current to an intermediate value. For example, the system may initially adjust the bias current to 2 mA.

The system then counts the number of oscillations on the output of the oscillator circuit (step 500-4). With each oscillation, the system determines if a step-down count value has been reached (step 500-6). In other words, the system determines if a predetermined number of transitions have occurred (e.g., 1000 transitions) after startup. If so, the system proceeds to step 506 in FIG. 5A to adjust the bias current to the steady state bias current.

If not, the system determines if a step-up count value has been reached (step 500-8). In other words, the system determines if a predetermined number of transitions (e.g., 250 transitions) have occurred since the last adjustment to the startup bias current. If not, the system returns to step 500-4 to count the number of oscillations on the output of the oscillator circuit.

Otherwise, the system adjusts the variable current source to input a larger startup bias current into the oscillator circuit (step 500-10). For example, the system may increase the startup bias current by an increment of 2 mA. (Note that the count values for the step-up count and the step down count are such that the system is prevented from adjusting the bias current past a maximum bias current value.) The system then returns to step 500-4 to count the number of oscillations on the output of the oscillator circuit.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit for controlling a startup time of an oscillator circuit, comprising:
    a variable current source coupled to the oscillator circuit, wherein a startup time of the oscillator circuit is proportional to a bias current input into the oscillator circuit from the variable current source; and
    a control mechanism coupled to the variable current source and to the output of the oscillator circuit, wherein upon startup the control mechanism is configured to adjust the variable current source to input a large startup bias current into the oscillator circuit; and
    an oscillation-detection mechanism in the control mechanism, wherein the oscillation-detection mechanism includes:
        a counter mechanism configured to count transitions in the output of the oscillator circuit; and
        an adjustment mechanism configured to adjust the variable current source to input a reduced steady-state bias current into the oscillator circuit after the transition count for the output of the oscillator circuit reaches a predetermined number during startup;
    wherein the control mechanism adjusts the variable current source to one or more bias currents between the large startup bias current and the steady-state bias current when a predetermined number of oscillations corresponding to each of the one or more bias currents have occurred during startup.

2. The circuit of claim 1, wherein the oscillation-detection mechanism includes a comparison mechanism configured to detect transitions in the output of the oscillator circuit.

3. The circuit of claim 2, wherein the variable current source is configured to output a bias current proportional to a value of a control signal, wherein the adjustment mechanism is configured to change the value of the control signal when adjusting the variable current source.

4. The circuit of claim 3, further comprising a mapping mechanism configured to convert an adjustment from the adjustment mechanism into a value for the control signal which is used to adjust the variable current source, wherein the mapping mechanism is configured to use the count to determine the value for the control signal.

5. The circuit of claim 3, wherein the variable current source is configured to be controlled digitally, and wherein the control signal includes one or more bits arranged in a control word.

6. The circuit of claim 2, wherein when detecting transitions in the output of the oscillator circuit, the comparison mechanism is configured to detect if the output of the oscillator circuit has transitioned through a reference value, wherein the reference value is:
    a predetermined value;
    a voltage on a node within the oscillator circuit; or
    an external voltage value.

7. A method for controlling a startup time of an oscillator circuit, wherein a startup time of the oscillator circuit is proportional to a bias current input into the oscillator circuit from the variable current source, comprising:
    upon startup, inputting a large startup bias current into the oscillator circuit;
    counting transitions in the output of the oscillator circuit;
    determining when the transition count for the output of the oscillator circuit has reached a predetermined number during startup; and
    adjusting the variable current source to input a reduced steady-state bias current into the oscillator circuit after the transition count for the output of the oscillator circuit reaches a predetermined number during startup;
    adjusting the variable current source to one or more bias currents between the large startup bias current and the steady-state bias current when a predetermined number of oscillations corresponding to each of the one or more bias currents have occurred during startup.

8. The method of claim 7, wherein determining the number of transitions in the output of the oscillator circuit involves detecting transitions in the output of the oscillator circuit.

9. The method of claim 8, wherein adjusting the variable current source to input a reduced steady-state bias current into the oscillator circuit involves changing a value of a control signal to the variable current source.

10. The method of claim 9, wherein the method further comprises using the count to determine the value for the control signal.

11. The method of claim 9, wherein the variable current source is controlled digitally, and wherein changing the value of the control signal to the variable current source involves changing one or more bits in a control word.

12. The method of claim 8, wherein detecting transitions in the output signal of the oscillator circuit involves detecting if the output signal of the oscillator has transitioned through a reference value, wherein the reference value is:
    a predetermined value;
    a voltage on a node within the oscillator circuit; or
    an external voltage value.

13. An electronic device for controlling a startup time of an oscillator circuit, comprising:
    a variable current source coupled to the oscillator circuit, wherein a startup time of the oscillator circuit is proportional to a bias current input into the oscillator circuit from the variable current source; and
    a control mechanism coupled to the variable current source and to the output of the oscillator circuit, wherein upon startup the control mechanism is configured to adjust the variable current source to input a large startup bias current into the oscillator circuit; and
    an oscillation-detection mechanism in the control mechanism, wherein the oscillation-detection includes:
        a counter mechanism configured to count transitions in the output of the oscillator circuit; and
        an adjustment mechanism configured to adjust the variable current source to input a reduced steady-state bias current into the oscillator circuit after the transition count for the output signal reaches a predetermined number during startup;
    wherein the control mechanism adjusts the variable current source to one or more bias currents between the large startup bias current and the steady-state bias current when a predetermined number of oscillations corresponding to each of the one or more bias currents have occurred during startup.

14. The electronic device of claim 13, wherein the oscillation-detection mechanism includes:
a comparison mechanism configured to detect transitions in the output of the oscillator circuit.

15. The electronic device of claim 14, wherein the variable current source is configured to output a bias current proportional to a value of a control signal, wherein the adjustment mechanism is configured to change the value of the control signal when adjusting the variable current source.

16. The electronic device of claim 15, further comprising a mapping mechanism configured to convert an adjustment from the adjustment mechanism into a value for the control signal which is used to adjust the variable current source, wherein the mapping mechanism is configured to use the count to determine the value for the control signal.

17. The electronic device of claim 15, wherein the variable current source is configured to be controlled digitally, and wherein the control signal includes one or more bits arranged in a control word.

18. The electronic device of claim 14, wherein when detecting transitions in the output of the oscillator circuit, the comparison mechanism is configured to detect if the output of the oscillator circuit has transitioned through a reference value, wherein the reference value is:

a predetermined value;

a voltage on a node within the oscillator circuit; or an external voltage value.

* * * * *